(12) United States Patent
Sowlati

(10) Patent No.: US 6,496,074 B1
(45) Date of Patent: Dec. 17, 2002

(54) CASCODE BOOTSTRAPPED ANALOG POWER AMPLIFIER CIRCUIT

(75) Inventor: Tirdad Sowlati, Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 118 days.

(21) Appl. No.: 09/671,890

(22) Filed: Sep. 28, 2000

(51) Int. Cl.[7] .................................................. H03F 1/22

(52) U.S. Cl. ........................................ 330/311; 330/98

(58) Field of Search ........................... 330/98, 110, 277, 330/302, 311

(56) References Cited

U.S. PATENT DOCUMENTS

| | | | |
|---|---|---|---|
| 3,268,827 A | 8/1966 | Carlson et al. | 330/18 |
| 4,100,438 A | 7/1978 | Yokoyama | 307/304 |
| 4,284,905 A | 8/1981 | Rosenweig | 307/482 |
| 4,317,055 A | 2/1982 | Yoshida et al. | 307/304 |
| 6,137,367 A | * 10/2000 | Ezzedine et al. | 330/98 X |

OTHER PUBLICATIONS

Rodwell, Mark et al. "33 Ghz Monolithic Cascode AlInAs/GaInAs Heterojunction Bipolar Transistor Feedback Amplifier", IEEE 1990 Bipolar Circuits and Technology Meeting, 1990, pp. 252–255.*

* cited by examiner

*Primary Examiner*—Steven J. Mottola
(74) *Attorney, Agent, or Firm*—Steven R. Biren

(57) ABSTRACT

A cascode bootstrapped analog power amplifier circuit includes a first MOSFET and a second MOSFET connected in series and coupled between a dc voltage source terminal and a common terminal. An rf input signal terminal is coupled to a gate electrode of the first MOSFET and a dc control voltage terminal is coupled to a gate electrode of the second MOSFET, with a unidirectionally-conducting element such as a diode-connected MOSFET being coupled between a drain electrode and the gate electrode of the second MOSFET. The output of the amplifier circuit is taken from the drain electrode of the second MOSFET. This circuit configuration, permits he first and second MOSFETs to withstand a larger output voltage swing, thus permitting the use of a higher supply voltage and resulting in a substantially increased maximum output power capability for a given load value.

8 Claims, 1 Drawing Sheet

CASCODE BOOTSTRAPPED ANALOG POWER AMPLIFIER CIRCUIT

BACKGROUND OF THE INVENTION

The invention is in the field of transistor amplifier circuits, and relates more particularly to power amplifier circuits suitable for use in nigh-frequency applications.

Analog power amplifier circuits (as distinct from Class E or switching circuits) used in high-frequency applications are typically operated in Class A, AB, B, C, or F, with the active component being operated as an analog amplifier over the selected conduction angle. Such power amplifiers have been used in wireless communications apparatus and have been designed in both GaAs MOSFET and deep-submicron CMOS technology.

In such power amplifiers, the signal swing at the drain of the output transistor can typically be as much as three times the power supply voltage. This imposes a limitation on the maximum supply voltage that can be used to avoid gate-drain breakdown in MOS transistors. Thus, for example, in a 0.25 micron CMOS process, the nominal supply voltage is 2.5 volts. However, a 2.5 volt Class B amplifier cannot be designed in this process, as the gate breakdown voltage is 6 volts. In conventional cascode-configured amplifiers, where one transistor is in a common-source configuration and the other is in a common-gate configuration, with the common-gate transistor having a constant dc gate voltage and the gate being essentially at ground at the operating frequency, the breakdown problem is reduced but not eliminated.

Although various prior-art techniques exist for improving circuit performance using series-connected transistors and bootstrappting techniques, as shown in U.S. Pat. Nos. 3,268,827; 4,100,438; 4,284,905; and 4,317,055, these references do not address the issue of how to maximize usable power supply voltage in cascode analog power amplifier circuits. Accordingly, it would be desirable to have a cascode power amplifier circuit in which power output is not limited by operating the output stage at less than he nominal supply voltage due to component breakdown restraints.

SUMMARY OF THE INVENTION

It is therefore an object of the invention to provide a cascode analog power amplifier circuit in which the useable power supply voltage is maximized, so that power output is not limited by voltage constraints imposed by component breakdown characteristics.

In accordance with the invention, this object is achieved by a new analog power amplifier circuit in a cascode bootstrapped configuration in which a first MOSFET and a second MOSFET are connected in series and coupled between a dc voltage source terminal and a common terminal, with an rf input signal terminal being coupled to a gate electrode of the first MOSFET and a dc control voltage terminal being coupled to a gate electrode of the second MOSFET. In order to provide a bootstrapping effect, a unidirectionally-conducting element is coupled between a drain electrode and the gate electrode of the second MOSFET, and an output of the amplifier circuit is taken from the drain electrode of the second MOSFET.

In a preferred embodiment of the invention, the dc control voltage source terminal is coupled to the gate electrode of the second MOSFET by a resistor, and the rf input signal terminal is coupled to the gate electrode of the first MOSFET by a capacitor.

In a further preferred embodiment of the invention, the unidirectionally-conducting element is a diode-connected MOSFET, which implements the bootstrapping effect.

In yet a further preferred embodiment of the invention, a resistor is coupled in series with the unidirectionally-conducting element.

A cascode bootstrapped analog power amplifier circuit in accordance with the present invention offers a significant improvement over prior-art analog power amplifiers in that the useable power supply voltage is maximized to achieve substantially increased power output.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which the single FIGURE shows a simplified schematic diagram of a cascode bootstrapped analog power amplifier circuit in accordance with the invention.

DESCRIPTION OF THE PREFERRED EMBODIMENTS

Figure 1:
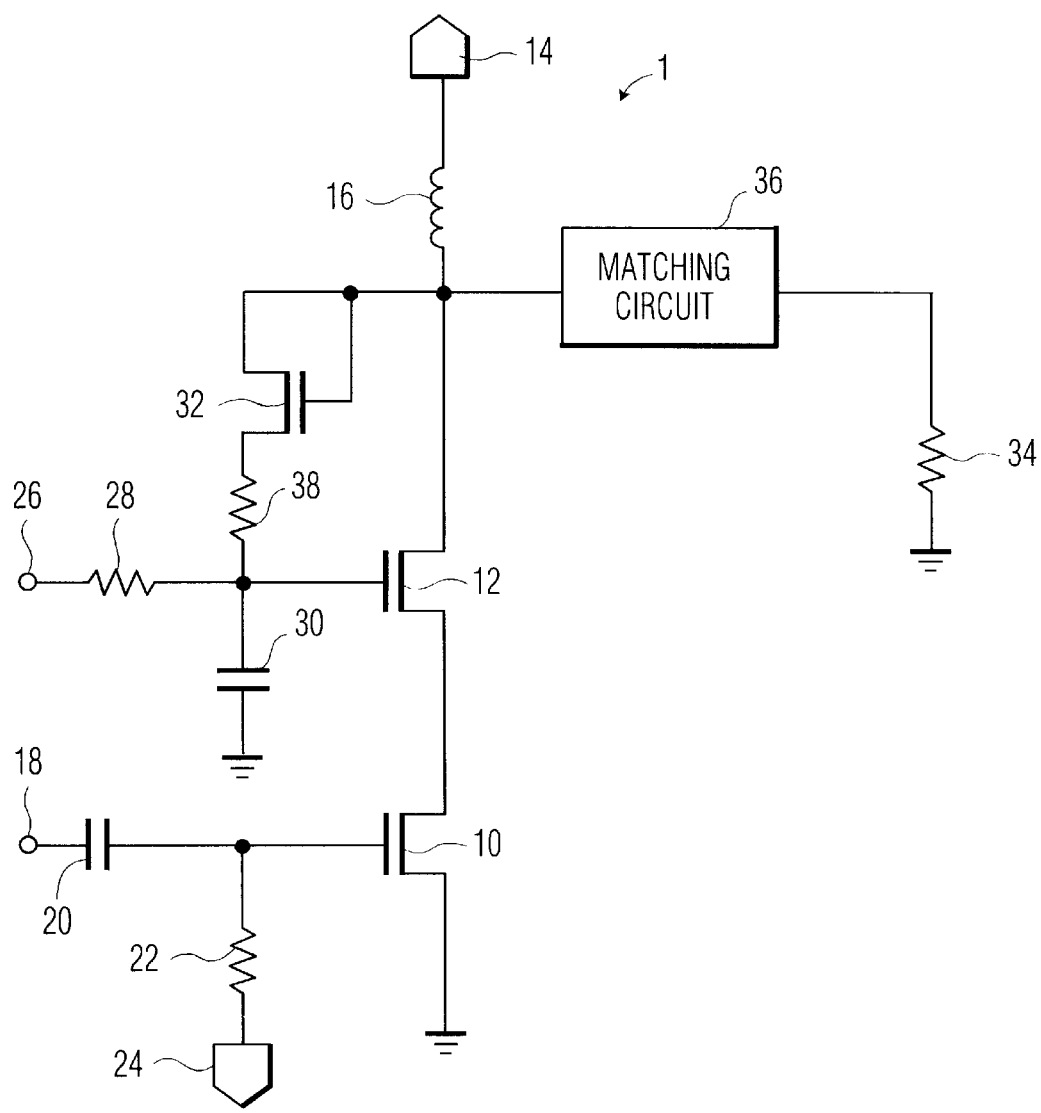

In conventional analog cascode amplifiers, the upper transistor (analogous to transistor 12 in the FIGURE) operates in a common-gate mode, while the lower transistor (analogous to transistor 10 in the FIGURE) operates in a common-source mode. In order for the upper transistor to operate in the common-gate mode, its gate is typically connected to ground through a tuned circuit comprising a capacitor and an inductor, with the latter typically being formed from bond wire inductance. Since such series LC resonators are typically narrowband in nature, several inductor-capacitor pairs must be used, thus requiring several bond pads and a larger chip area. In this manner, the gate of the upper transistor is essentially at rf around and its voltage essentially does not vary, thus achieving the desired common-gate operating mode. However, when a cascode amplifier is operated in this manner, the stage must still be operated at less than the nominal supply voltage to avoid component breakdown, thus limiting power output.

The present invention overcomes the foregoing drawback by recognizing that the conventional approach of providing an rf ground at the gate of the upper transistor, although required in small-signal operation, is not required in large-signal applications such as power amplifiers. By permitting the voltage at the upper gate to have an rf swing, in a manner to be described below, a high output power and a high power-added efficiency can be obtained.

A simplified schematic diagram of a cascode bootstrapped analog power amplifier circuit 1 in accordance with the invention is shown in the FIGURE. This amplifier can be operated in Class A, AB, B, C, or F by providing appropriate bias conditions. The amplifier circuit includes a first MOSFET 10 having its main current path connected in series with the main current path of a second MOSFET 12, with the series-connected pair coupled between a dc voltage source terminal 14 and a common terminal (ground) by an inductor 16 connected to terminal 14.

An rf input signal terminal 18 is coupled to a gate electrode of MOSFET 10 by a coupling capacitor 20, and a dc bias voltage is provided to the gate of MOSFET 10 by a resistor 22 connected to a source of bias voltage 24.

The gate of MOSFET 12 is coupled to a dc control voltage terminal 26 by a resistor 28, and the gate of MOSFET 12 is also coupled to ground by a capacitor 30, which provides a finite impedance at the operating frequency. Additionally, the gate and drain of MOSFET 12 are coupled by a unidirectionally-conducting element, here a diode-connected MOSFET 32, that conducts when the drain voltage is greater than the gate voltage. This diode-connected MOSFET provides a bootstrapping effect in a manner which will be described hereinafter. Component 32 may alternatively be a pn diode.

The output of the active portion of the amplifier circuit, taken from the drain of MOSFET 12, is coupled to a load shown symbolically by resistor 34 through a matching circuit 36.

As noted above, conventional operation of prior-art cascode amplifiers imposes certain limitations on the maximum supply voltage that can be used to avoid gate-drain breakdown, thus substantially reducing the maximum available output power.

A substantial improvement in output power may be achieved by utilizing a cascode bootstrapped analog power amplifier circuit as shown in the FIGURE. This improvement is obtained by coupling a unidirectionaliy-conducting element, here diode-connected MOSFET 32, between the drain electrode and gate electrode of MOSFET 12 in order to simply and efficiently achieve the des red bootstrapping effect. When the signal at the gate of MOSFET 10 is increasing, the current in transistors 10 and 12 will be increasing, and the voltage at the drain of transistor 12 will be going low. Accordingly, element 32 will be nonconducting, and will play no role in circuit operation. When the voltage at the gate of MOSFET 10 goes low, the current in MOSFET 10 will decrease, and the voltage at the drain of MOSFET 12 will start to increase. Once this voltage rises above the do voltage applied to the gate of MOSFET 12 plus the threshold voltage of diode-connected MOSFET 32, component 32 will begin conducting, and will cause the voltage at the gate of MOSFET 12 to increase, following the increase in the voltage at the drain. By appropriately selecting the value of components 28 and 30, as well as the geometry of component 32, the drain-gate voltage of MOSFET 12 can be appropriately controlled. Since the voltage at the gate of MOSFET 12 controls its source voltage, and the source of MOSFET 12 is connected to the drain of MOSFET 10, the gate-drain voltage of MOSFET 10 can also be controlled.

A further degree of control over the drain-gate voltage of MOSFET 12 can be obtained by providing a resistor 38 in series with diode-connected MOSFET 32. This resistor, which provides a voltage drop when the component 32 conducts, limits the current through the series path composed of components 32 and 38 and also shifts the point where component 32 starts to conduct. Additionally, the value of resistor 38 may be selected to control the charging rate on capacitor 30, thus affording additional design flexibility by optimizing the delay in the rise of the gate voltage of transistor 12 and permitting the distribution of voltage between transistors 10 and 12 to be optimized.

It has been found that optimum breakdown capability is obtained when components 10 and 12 receive substantially the same maximum drain-gate voltage, as this permits use of the largest possible supply voltage for a given transistor design without either transistor breaking down. By appropriately selecting parameters for components 28, 30, 32, and 38 as discussed above, to achieve this condition, the circuit of the invention can be operated with a substantially greater supply voltage than a conventional amplifier circuit, thus significantly increasing output power for a given load value.

In this manner, the present invention provides a cascode bootstrap analog power amplifier circuit in which the useable power supply voltage can be maximized, so that power output is not limited by the need to operate the output stage at a lower voltage than the nominal supply voltage in order to avoid component breakdown. Additionally, the improvement achieved by the invention can be implemented in a simple and economical circuit configuration.

While the invention has been particularly shown and described with reference to a preferred embodiment thereof, it will be understood by those skilled in the art that various changes in form and detail may be made without departing from the spirit or scope of the invention. Thus, for example, the invention may be applied to GaAs MOSFET or GaAs PHEMT technology as well as CMOS technology. Additionally, different types of transistors or other components may be employed, and alterations to the circuit configuration may be made to suit particular design requirements.

What is claimed is:

1. A cascode bootstrapped analog power amplifier circuit comprising a first MOSFET and a second MOSFET connected in series and coupled between a dc voltage source terminal and a common terminal, an rf input signal terminal being coupled to a gate electrode of said first MOSFET and a dc control voltage terminal being coupled to a gate electrode of said second MOSFET for applying an external dc voltage to said second MOSFET gate electrode but not said first MOSFET gate electrode, a unidirectionally-conducting element being coupled between a drain electrode and said gate electrode of said second MOSFET, and an output of said amplifier circuit being taken from said drain electrode.

2. A cascode bootstrapped analog power amplifier circuit as in claim 1, wherein a drain electrode of said second MOSFET is coupled to said dc voltage source terminal by an inductor and a source electrode of said first MOSFET is connected to said common terminal.

3. A cascode bootstrapped analog power amplifier circuit as in claim 2, wherein the output of said amplifier circuit is coupled to a load by a matching circuit.

4. A cascode bootstrapped analog power amplifier circuit as in claim 1, wherein said dc control voltage source terminal is coupled to said gate electrode of the second MOSFET by a resistor and said rf input signal terminal is coupled to the gate electrode of the first MOSFET by a capacitor.

5. A cascode bootstrapped analog power amplifier circuit as in claim 1, wherein said unidirectionally-conducting element comprises a diode-connected MOSFET.

6. A cascode bootstrapped analog power amplifier circuit as in claim 5, wherein a resistor is connected in series with said diode-connected MOSFET.

7. A cascode bootstrapped analog power amplifier circuit as in claim 1, wherein a resistor is coupled in series with said unidirectionally-conducting element.

8. A cascode bootstrapped analog power amplifier circuit as in claim 1, wherein said amplifier is one of a Class A, Class AB, Class B, Class C, and Class F amplifier.

* * * * *